United States Patent
Hareland et al.

(10) Patent No.: US 6,897,098 B2
(45) Date of Patent: May 24, 2005

(54) METHOD OF FABRICATING AN ULTRA-NARROW CHANNEL SEMICONDUCTOR DEVICE

(75) Inventors: Scott A. Hareland, Tigard, OR (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/629,039

(22) Filed: Jul. 28, 2003

(65) Prior Publication Data

US 2005/0026333 A1 Feb. 3, 2005

(51) Int. Cl.⁷ .............................................. H01L 21/82
(52) U.S. Cl. ...................... 438/128; 438/129; 438/183; 438/184; 257/210
(58) Field of Search ................................ 438/128–129, 438/183–184; 257/210

(56) References Cited

U.S. PATENT DOCUMENTS

| | | |
|---|---|---|
| 5,612,255 A | 3/1997 | Chapple-Sokol et al. |
| 5,858,256 A | 1/1999 | Minne et al. |
| 6,103,540 A | 8/2000 | Russell et al. |
| 2003/0006410 A1 | 1/2003 | Doyle |
| 2004/0136866 A1 * | 7/2004 | Pontis et al. ................. 422/57 |

OTHER PUBLICATIONS

Fukuda, H., et al., "Fabrication Of Silicon Nanopillars Containing Polycrystalline Silicon/Insulator Multilayer Structures," Appl. Phys. Lett. vol. 70, No. 3, Jan. 1997, pp. 333–335.

PCT Search Report dated Dec. 28, 2004, 7 pages.

Takahashi, Akira, et al., "Si Single–Electron Transistors on SIMOX Substrates," IEICE Electron, vol., E79–C, Nov. 11, 1996, pp. 1503–1508.

Tsutsumi, Toshiyuki, et al., "Close Observation of the Geometrical Features of an Ultranarrow Silicon Nanowire Device," Japanese Journal of Applied Science, vol. 41, No. 6B, Part 1, Jun. 2002, pp. 4419–4422.

* cited by examiner

*Primary Examiner*—Dung A. Le
(74) *Attorney, Agent, or Firm*—Blakely, Sokoloff, Taylor & Zafman LLP

(57) ABSTRACT

A method of forming a nanowire is disclosed. A nanowire having a first dimension is deposited on a first dielectric layer that is formed on a substrate. A sacrificial gate stack having a sacrificial dielectric layer and a sacrificial gate electrode layer is deposited over a first region of the nanowire leaving exposed a second region and a third region of the nanowire. A first spacer is deposited on each side of the sacrificial gate stack. A second dielectric layer is deposited over the first dielectric layer to cover the second region and third region. The sacrificial gate stack is removed. The first region of the nanowire is thinned by at least one thermal oxidation process and oxide removal process to thin said first region from said first dimension to a second dimension.

25 Claims, 7 Drawing Sheets

US 6,897,098 B2

METHOD OF FABRICATING AN ULTRA-NARROW CHANNEL SEMICONDUCTOR DEVICE

BACKGROUND

1. Field

A method of fabricating an ultra-small nanowire and a semiconductor device having an ultra-narrow channel formed in the nanowire.

2. Description or the Related Art

Advances in semiconductor devices and the ongoing quest for miniaturization of the semiconductor devices lead to a demand for a better fabrication process for nanoscale structures. Semiconductor devices are being made on nanoscale structures since smaller devices typically equate to faster switching times, which lead to speedier and better performance. Devices based upon nanoscale structures having ultra-small dimensions are thus a natural progression of semiconductor device scaling. For example, devices have been made on a semiconductor nanoscale structures generally known as "nanowire." A nanowire is referred to as a semiconductor (e.g., silicon) structure having dimensions in the order of nanometers. Current methods of fabricating nanowires include photolithography and vapor liquid solid epitaxy deposition.

In photolithography, a thin layer of semiconductor material (e.g., silicon) is deposited on a substrate and then patterned to form nanowires on the substrate. In vapor liquid solid epitaxy deposition, metal colloids (e.g., gold or nickel) in nanodimensions are exposed to a silicon source gas (e.g. silane) under high temperature. Silicon is then decomposed and grown on the colloids forming silicon nanowires. The silicon nanowires are removed from the colloids and are deposited on a substrate. Under both methods, the dimensions of the nanowires are difficult to control especially for dimension less than 5 nm.

In addition, in devices made on nanowires, the device channels are extremely narrow channels (<10 nm) can exhibit 1-D device transport which promises higher mobility and possible ballistic transport to improve device performance. However, methods of making these ultra-small channels in a controllable way are not yet currently compatible with high-volume manufacturing process.

BRIEF DESCRIPTION OF THE DRAWINGS

The disclosure is illustrated by way of example and not by way of limitation in the figures of the accompanying drawings in which like references indicate similar elements. The invention may best be understood by referring to the following description and accompanying drawings that are used to illustrate embodiments of the invention. In the drawings.

DETAILED DESCRIPTION

Figure 1:
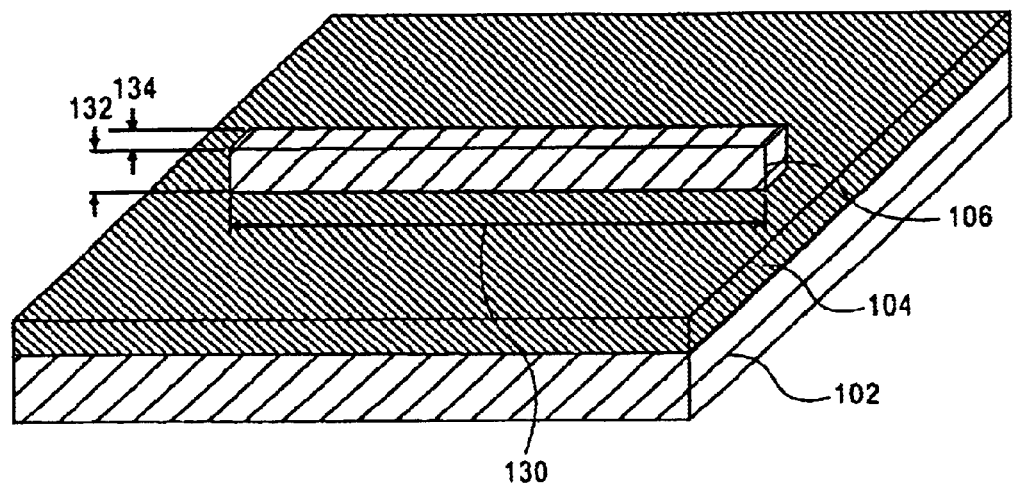
FIG. 1 illustrates a nanowire formed on a substrate.

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are now set forth in detail.

As discussed above, nanoscale structures such as nanowires are extremely difficult to make with reliable and controllable dimensions. Current methods used to make nanowires include dimensional control of initial growth from nanometer sized nucleation sites or lithographic and patterning methods to print small dimensional structures that then use over-etching techniques to reduce the dimensions of the nanowires. These approaches can be difficult in practice, especially when trying to control the dimensions of billions of small regions across a giant 300 mm wafer.

Exemplary embodiments of the present invention describe methods of making nanowires that allow for easy control of the dimensions of the nanowires. More particularly, the embodiments disclose methods of making nanowires that have at least one region (e.g., the middle region) being extremely small or ultra-narrow (e.g., having dimensions about less than 5 nm). Further, as will be apparent from the discussion below that the embodiments demonstrate a reliable and controllable way to fabricate an ultra-small nanowire (e.g., having dimensions of about less than 5 nm) and/or to fabricate a nanowire that has an ultra-small or ultra-narrow channel region useful for making other semiconductor devices.

In one embodiment, a method of reducing a dimension of a nanowire is disclosed. A nanowire is deposited on a first dielectric layer that is formed on a substrate. The nanowire has a first dimension. The nanowire provides a first region, a second region, and a third region. A sacrificial gate stack having a sacrificial dielectric layer and a sacrificial gate electrode layer is deposited over the first region of the nanowire leaving exposed the second region and the third region of the nanowire. A first spacer is deposited adjacent each side of the sacrificial gate stack. A second dielectric layer is deposited over the first dielectric layer to cover the second region and third region. The sacrificial gate electrode and the sacrificial dielectric layer are removed after the first spacer is deposited. Removing the sacrificial gate electrode and the sacrificial dielectric layer exposes the first region of the nanowire. The first region of the nanowire is thinned by at least one thermal oxidation and oxide removal process. After thinning, the first region has a second dimension that is smaller than the first dimension. Thinning the first region of the nanowire provide the first region of the nanowire with a cross-sectional dimension that is substantially smaller (e.g., ten times or at least two times smaller) than that of the second region and the third region. The first region can be the middle region of the nanowire and the second and third regions can be the side regions of the nanowire.

In another embodiment, a method of fabricating a nanowire is disclosed. A nanowire is deposited on a first dielectric layer that is formed on a substrate. The nanowire has a first dimension. A sacrificial dielectric layer is deposited over a first region of the nanowire and an etchable sacrificial layer is deposited over the sacrificial dielectric layer leaving exposed a second region and a third region of the nanowire. A first spacer is deposited adjacent each side of the sacrificial dielectric layer and the etchable sacrificial layer. A second dielectric layer is deposited over the first dielectric layer to cover the second region and third region. The etchable sacrificial layer and the dielectric layer are etched away. After the sacrificial dielectric layer and the etchable sacrificial layer are removed, the first region of the nanowire is exposed. The first region of the nanowire is thinned by at least one thermal oxidation and oxide removal process. After thinning, the first region has a second dimension that is smaller than the first dimension. In addition, thinning the first region of the nanowire provides the first region with a cross-sectional dimension that is substantially smaller (e.g., ten times or at least two times smaller) than that of the second region and third region of the nanowire.

In another embodiment, a method of fabricating a semiconductor device in a nanowire is disclosed. A nanowire is deposited on a first dielectric layer that is formed on a substrate. The nanowire has a first dimension. A sacrificial dielectric layer is deposited over a first region of the nanowire and an etchable sacrificial layer is deposited over the sacrificial dielectric layer leaving exposed a second region and a third region of the nanowire. The first region defines a channel region for the semiconductor device. The second and third regions define source/drain regions for the semiconductor device. A first spacer is deposited adjacent each side of the sacrificial dielectric layer and the etchable sacrificial layer. A second dielectric layer is deposited over the first dielectric layer to cover the second region and third region. The etchable sacrificial layer and the sacrificial dielectric layer are etched away. Etching away the etchable sacrificial layer and the dielectric layer exposes the first region of the nanowire. The first region of the nanowire is thinned by at least one thermal oxidation and oxide removal process to provide the first region with a second dimension that is smaller or substantially smaller (e.g., ten times or at least two times smaller) than the first dimension. A device gate stack comprising a third dielectric layer and a gate electrode is deposited over the first region. The semiconductor device formed in the nanowire thus has a channel region that is smaller or substantially smaller than the source/drain regions of the device.

The following section describes exemplary methods of making the nanowires and the semiconductor devices as mentioned above. In FIG. 1, a substrate 102 is provided. In one embodiment, the substrate 102 is made of a semiconductor material such as silicon. The substrate 102 can be a monocrystalline silicon, a polycrystalline silicon, an amorphous silicon, or a silicon alloy. In some embodiments, the substrate 102 is a silicon on insulator (SOI) substrate. The substrate 102 can also be any suitable semiconductor substrate typically used for fabricating semiconductor devices as is known in the art.

As shown in FIG. 1, the substrate 102 is insulated with a thin layer of dielectric layer 104, which may be comprised of an insulating material such as silicon dioxide ($SiO_2$), silicon nitride ($Si_3N_4$), or other suitable semiconductor insulating material. The dielectric layer 104 can be formed on the substrate 102 using conventional methods such as chemical vapor deposition (CVD) or physical deposition. The dielectric layer 104 functions to isolate one nanowire from another and/or to isolate one device formed in the nanowire from another.

As shown in FIG. 1, at least one nanowire 106 is formed on the dielectric layer 104. For the purpose of the disclosure, a nanowire is referred to as a semiconductor strip (e.g., a silicon strip) that has a thickness ranging from a few nanometers (nm) (e.g., 10 nm) to a few hundreds nanometers (e.g., 100–200 nm). A nanowire can also be referred to a semiconductor strip that has cross-sectional dimensions (e.g., height and width) in the order of nanometers. The nanowire 106 can be grown, deposited, or patterned on the dielectric layer 104. In one embodiment, the nanowire 106 is formed using a conventional method that can reliably deposit a silicon strip in the order of 10–100 µm thick. In one embodiment, the nanowire 106 is deposited using a process called Vapor Liquid Solid Epitaxy (VLSE). In the VLSE process, metal colloids (e.g., gold or nickel) are exposed to a silicon source gas (e.g., SiH4) and high temperature. The silicon source gas is dissolved into the colloidal particles and silicon sections are grown on the colloids. The silicon sections are then removed and deposited on the dielectric layer 104. VLSE is known in the art. In another embodiment, the nanowire 106 is deposited using conventional lithography and etching processes in which a thin silicon film is deposited on the dielectric layer 104, using method such as CVD or plasma enhanced CVD, and patterned (e.g., etching) to form the individual nanowire 106. It is to be noted that other methods can be used to form the nanowire 106 on the dielectric layer 104 as is known in the art.

In one embodiment, the nanowire 106 has first cross-sectional dimensions that are in the order of nanoscale. The nanowire 106 has a first length 130, which can be about 100 nm to about few microns depending on application. The nanowire 106 has a first height 132 and a first width 134. The first height 132 and the first width 134 define the first cross-sectional dimension or the first thickness of the nanowire 106. For a reliable performance of the semiconductor device that will be formed in the nanowire 106, the first width 134 and the first height 132 need to be reliably controlled. In one embodiment, the nanowire 106 has a first height 132 of about 10–10 nm and a first width 134 of about 10–100 nm. The first height 132, first width 134, and first length 130 can be varied depending on the methods used to form the nanowire 106 on the dielectric layer 104. A method that can reliably and controllably forms the nanowire 106 in the order of about 10–100 nm is used to form the nanowire 106 on the dielectric layer 104.

As will be apparent from below, a semiconductor device such as a transistor is formed in the nanowire 106. For a superior semiconductor device, the nanowire 106 needs to be as thin as possible. More optimally, the channel region for the transistor should be as thin as possible. The cross-sectional dimension of the nanowire 106 or optimally, the cross-sectional dimension of the device channel region needs to be as thin as possible. In addition, the cross-sectional dimension of the nanowire 106 needs to be reliably controlled for an efficient and reliable performance of the device. The following sections describe a novel process of reliably fabricating an ultra-small or an ultra-narrow nanowire 106. First, a conventional method is used to deposit the nanowire 106 on the dielectric layer 104 as previously discussed. Then, at least one region of the nanowire 106 is thinned. The nanowire 106 is thinned at least at the region of the nanowire 106 that will form the channel region for the device. The following sections also describe a novel process of reliably fabricating an ultra-small semiconductor device from the nanowire 106. Even though the discussion focuses on fabricating a nanowire 106 for a transistor, it is to be appreciated that other semiconductor devices can be formed in the nanowire 106 without deviating from the scope of the embodiments.

Figure 2:
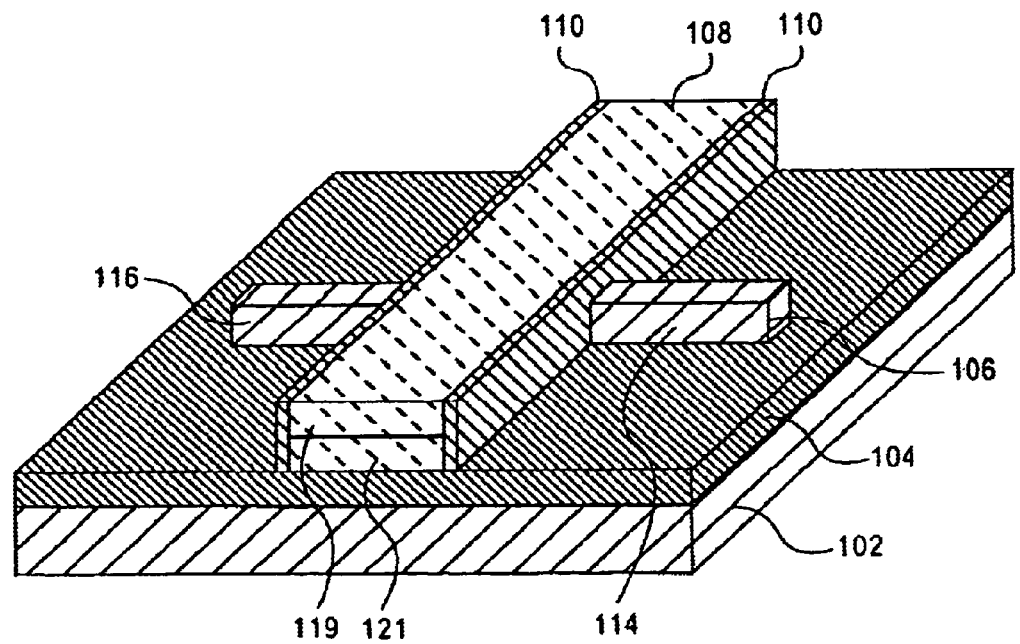
FIG. 2 illustrates a sacrificial gate stack formed over the nanowire of FIG. 1.

In FIG. 2, a sacrificial gate stack 108 is formed (via a planar deposition process) over a first region of the nanowire 106. In one embodiment, the first region is the middle region of the nanowire 106. In one embodiment, the sacrificial gate stack 108 forms a sacrificial tri-gate structure covering all three exposed sides of the middle region of the nanowire 106. In another embodiment, the sacrificial gate stack 108 is a non-planner structure because it is formed to wrap around all exposed sides of the middle region of the nanowire 106. After the sacrificial gate stack 108 is formed over the middle region, the remaining regions of the nanowire 106 are the second region 114 and the third region 116. The regions 114 and 116 are left exposed at this point. In one embodiment, the first region will form the device channel region and the second region 114 and the third region 116 will form the source and drain regions for a semiconductor device formed in the nanowire 106.

Continuing with FIG. 2, the sacrificial gate stack 108 includes a sacrificial gate electrode 119 and on a sacrificial dielectric layer 121. In one embodiment, the sacrificial gate stack 108 is a conventional gale stack as known in the art. In one embodiment, the sacrificial gate electrode 119 is a polysilicon film and the sacrficial dielectric layer 121 is a silicon oxide film. The sacrificial dielectric layer 121 and the sacrificial gate electrode 119 are deposited over the middle region of the nanowire 106 using any semiconductor deposition methods known in the art such as CVD. In another embodiment, the sacrificial gate electrode 119 is replaced with an etchable sacrificial layer that can be easily and selectively etched off. The sacrificial gate electrode 119 thus needs not be polysilicon and/or needs not be conductive. The sacrificial gate electrode 119 only needs to be removable and or etchable.

Continuing with FIG. 2, a first spacer 110 is formed adjacent each side of the sacrificial gate stack 108. The spacer 110 is similar to a conventional spacer wall found in a semiconductor transistor. In one embodiment, the spacer 110 comprises silicon nitride or any other material suitable for a spacer wall of a transistor. The spacer 110 can be formed using methods known in the art such as CVD followed by patterning to form the spacer 110 adjacent each side of the sacrificial gate stack 108.

In one embodiment, a semiconductor epitaxial film (e.g., a silicon or germanium epitaxial film) is further formed over the second region 114 and the third region 116 of the nanowire 106. Since the second region 114 and the third region 116 will form the source/drain regions of a semiconductor device, it is optimal to make these regions as large as possible for better contact landings made to the source/drain regions. For nanoscale semiconductor devices, electrical contacts to the source/drain regions are often difficult to control due to the small surface areas of the nanowire. Forming an epitaxial film of a suitable thickness over the regions 114 and 116 allow the source/drain regions to be made larger than permitted by the dimensions of the nanowires 106. Electrical contacts to the source/drain regions thus can be obtained more easily. In addition, the epitaxial film may be used to decrease the series resistance of the source/drain regions formed in the second region 114 and third region 116. Better contact landings and lower series resistance for the source/drain regions lead to a better device performance. The epitaxial film may be of any suitable thickness that will give the second region 114 and third region 116 sufficient contact areas. In one embodiment, a semiconductor epitaxial film is deposited such that each of the second region 114 and third region 116 has a cross-sectional dimension that is about 3 times the first cross-sectional dimension of the nanowire 106. The epitaxial film is not shown in the FIG. 2. The epitaxial film can be formed over the second region 114 and the third region 116 using methods known in the art.

In one embodiment, the second region 114 and the third region 116 are implanted using conventional methods such as ion implantation to form the source/drain regions for a semiconductor device. A silicide layer (not shown) can be formed over each of the second region 114 and the third region 116 after the implantation to facilitate contacts to the source/drain regions. The silicide layer provides a low contact resistance to the source/drain regions formed in the second region 114 and the third region 116. The silicide layer can be formed of a metal such as cobalt, nickel, or etc. The silicide layer can be formed using conventional methods that deposit the metal over the second region 114 and the third region 116. After the metal is deposited, heat is applied to these regions to allow the silicon in these regions to react with the metals to form silicide.

Figure 3:
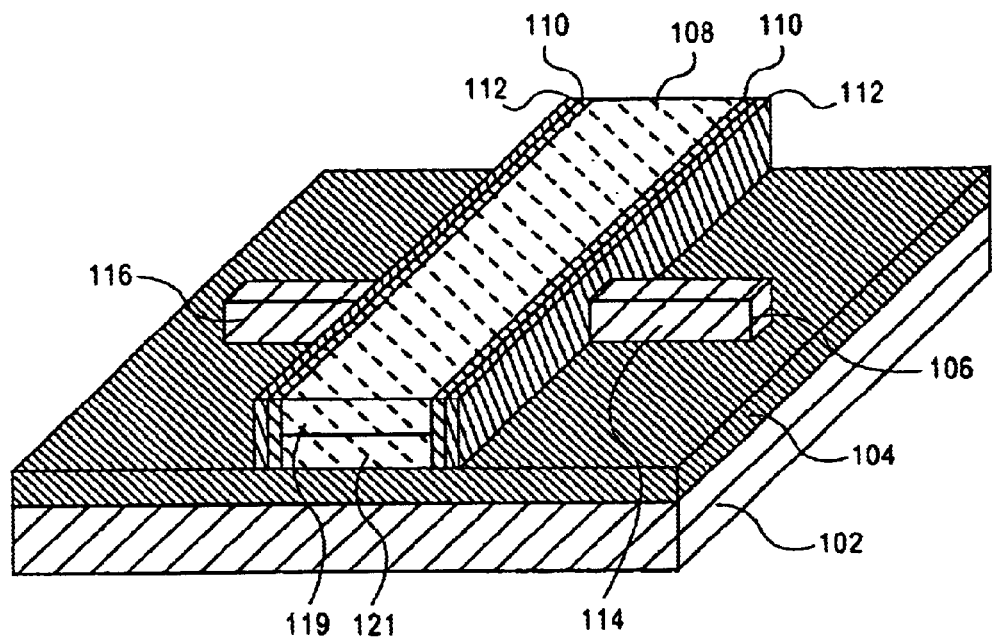
FIG. 3 illustrates a sacrificial gate stack and two spacers formed adjacent to the sacrificial gate stack that is formed over the nanowire.

As illustrated in FIG. 3, in one embodiment, a second spacer 112 is formed adjacent each side of the first spacer 110. The second spacer 112 is similar to the first spacer 110 and can be made out of nitride, similar materials as those used to form the first spacers 110, or other suitable materials known in the art. The second spacer 112 is beneficial in that it adds stress to the device to improve device performance. Additionally, when there are two spacers, 110 and 112, patterning to complete the device is easier.

Figure 4:
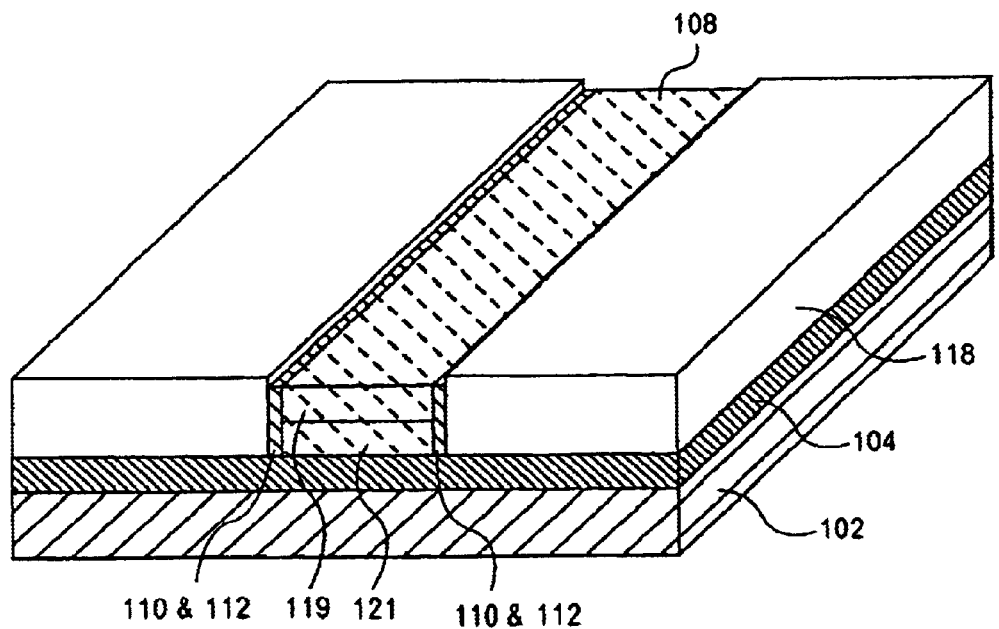
FIG. 4 illustrates a sacrificial gate stack, at least one spacer adjacent each side of the sacrificial gate stack, and a dielectric layer formed over the nanowire.

In FIG. 4, a dielectric layer 118 is formed over the dielectric layer 104 covering the second region 114 and the third region 116. The dielectric layer 118 is similar to a conventional interlayer dielectric layer. In one embodiment, the dielectric layer 118 is similar to the dielectric layer 104 and may be made of an insulating material such as silicon dioxide ($SiO_2$), silicon nitride ($Si_3N_4$), or other suitable insulating material. The dielectric layer 118 can be formed using conventional methods such as CVD. In one embodiment, the dielectric layer 118 is blanketly deposited over everything including the sacrificial gate stack 108. The dielectric layer 118 is then polished back to expose the top surface of the sacrificial gate electrode 119 of the sacrificial gate stack 108.

Figure 5:
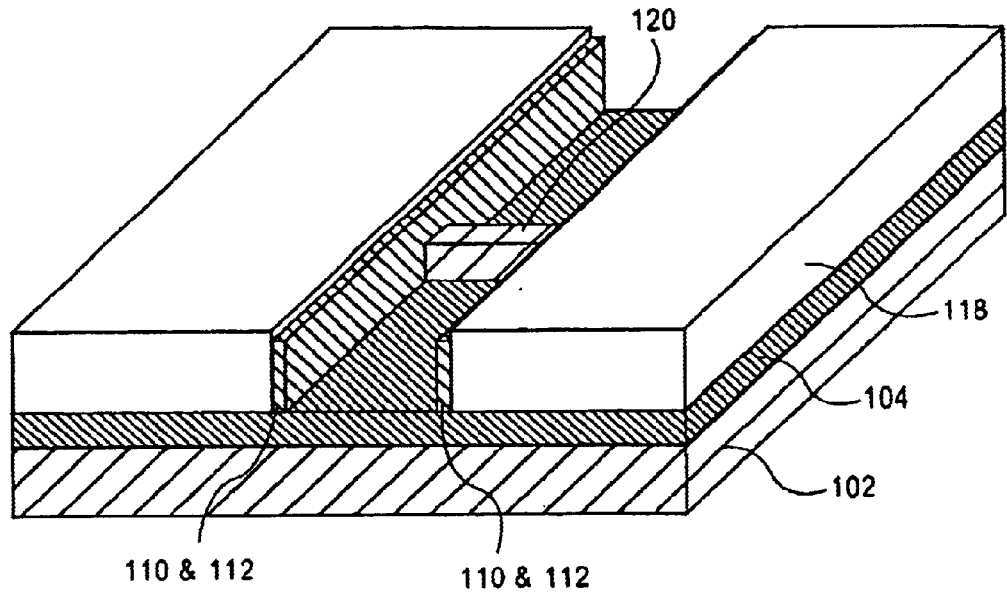
FIG. 5 illustrates the sacrificial gate stack of FIG. 4 is removed to expose a section of the nanowire.

In FIG. 5, the sacrificial gate stack 108 is removed. First, the sacrificial gate electrode 119 of the sacrificial gate stack 108 is removed. To remove the sacrificial gate electrode 119, a selective etching process that is selective to etch away the sacrificial gate electrode 119 is used. In the embodiment where the sacrificial gate electrode 119 is made of polysilicon, a conventional etching process typically used to remove polysilicon can be used to remove the sacrificial gate electrode 119. In one embodiment, a Tetra Methyl Ammonium Hydroxide (TMAII) or Potassium Hydroxide (KOH)

etching solution is used to remove the sacrificial gate electrode 119. These etching solutions etch away the polysilicon and are selective to silicon dioxide ($SiO_2$) and silicon nitride ($Si_3N_4$). Second, the sacrificial dielectric layer 121 is removed. In the embodiment where the sacrificial dielectric layer 121 is made of $SiO_2$, an etching process that is selective to remove $SiO_2$ is used to remove the sacrificial gate dielectric layer 121. For instance, a buffered etchant solution containing hydrofluoric acid and water can be used to remove the sacrificial dielectric layer 121. The etching process is controlled so that only the sacrificial dielectric layer 121 is removed leaving intact the first spacers 110 and the second spacers 112 and the dielectric layer 104. In one embodiment, the dielectric layer 104, the first spacers 110, and the second spacers 112 can be made of different materials (e.g., $SiO_2$ for the dielectric layer 104 and SiON or $Si_3N_4$ for the spacers 110 and 112) to ensure that only the sacrificial dielectric layer 121 is removed.

Figure 6:
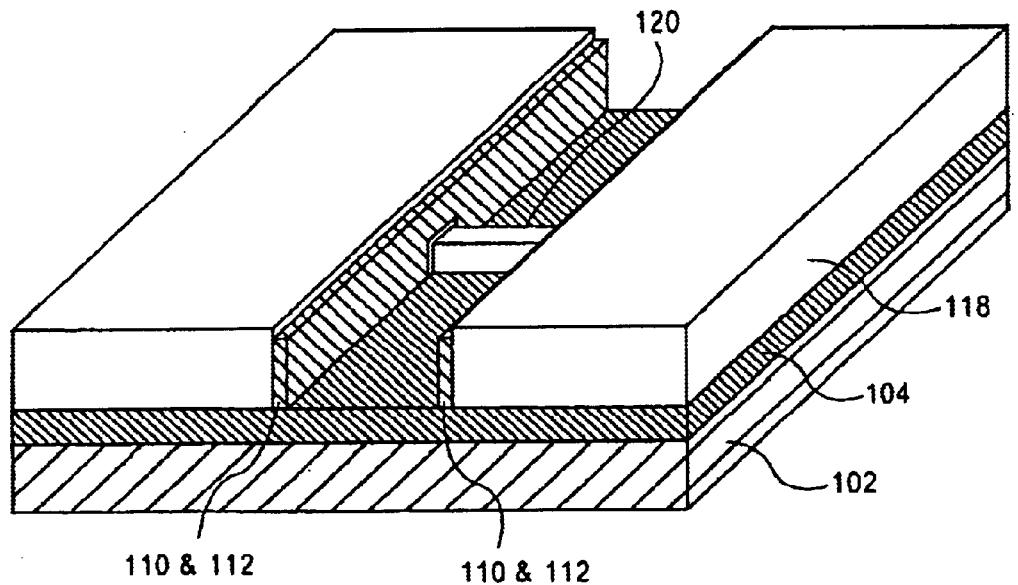
FIG. 6 illustrates thinning of the exposed section of the nanowire of FIG. 5 down to a desired dimension.

In FIG. 6, after the sacrificial gate stack 108 is removed, the middle region of the nanowire 106 is now exposed. In FIG. 6, the middle region is labeled as region 120. In one embodiment, the middle region 120 of the nanowire 106 is thinned to provide an ultra-narrow (e.g., having dimension less than 5 nm) channel for the device. In another embodiment, the middle region 120 is thinned to provide the nanowire 106 with at least one region that is ultra-small (e.g., having dimension less than 5 nm). As mentioned, the nanowire 106 is formed with a first cross-sectional dimension having a first height 132 of about 10–100 nm and a first width 134 of about 10–100 nm. The first cross-sectional dimension may also be referred to as the initial thickness of the nanowire 106. Before thinning, the middle region 120 has the same initial thickness or cross-sectional dimension as the rest of the nanowire 106 (e.g., about 10–100 nm). After thinning, the middle region 120 will have a second cross-sectional dimension that is smaller or substantially smaller than the first cross-sectional dimension. In one embodiment, the second cross-sectional dimension is less than about 5 nm or less than about 2–3 nm.

In one embodiment, at least one thermal oxidation process and at least one etching process are used to thin the middle region 120. The initial thickness (the first cross-sectional dimension) of the nanowire 106 can be thinned or reduced to a second thickness by controlled thermal oxidation and etching processes. In one embodiment, an oxide layer is controllably and thermally grown on the exposed surfaces of the middle region 120. The silicon on the exposed surfaces of the middle region 120 is consumed during the thermal oxidation process. In one embodiment, the amount of the silicon consumed is about 44% of the total thickness of the middle region 120 of the nanowire 106. For example, the nanowire 106 may have an initial thickness of the middle region 120 of about 10 nm. The thermal oxidation process would consume 4.4 nm of the silicon (44% of the silicon). After the thermal oxidation process, the thickness of the middle region 120 is about 5 nm or 5.6 mm. In one embodiment, in the thermal oxidation process, 0.44 nm of silicon is consumed to produce 1 nm of $SiO_2$. Thus, when a 10 nm thick nanowire 106 is oxidized, 4.4 nm of silicon is consumed and 10 nm of $SiO_2$ is produced. After the $SiO_2$ is removed, the nanowire 106 has a thickness of about 5.6 nm. The middle region 120 can be successively and repeatedly thermally oxidized and etched to achieve a desired thickness or cross-sectional dimension (e.g., about or less than 5 nm). For example, the nanowire 106 may have an initial thickness of the middle region 120 of about 100 nm. Several successive thermal oxidation and etching processes may be necessary to thin the middle region 120 down to about or less than 5 nm.

In another embodiment, a more aggressive thermal oxidation process can be used. The middle region 120 may be thermally oxidized at a temperature of about 800–900° C. for about 2 hours followed by a wet etching using a buffered oxide etchant such as hydrofluoric acid or equivalent. In an embodiment where the nanowire 106 has a first cross-sectional dimension of about 50 nm (e.g., a height 132 of about 100 nm and width 134 of about 50 nm), after the thermal oxidation at about 800–900° C. for about 2 hours followed by a wet etching using a buffered oxide etchant, the middle region 120 can be thinned down to a second cross-sectional dimension of about 5 nm (e.g., a height 132 of about 5 nm and width 134 of about 5 nm). Similar thermal oxidation and etching can be performed to further thin the nanowire 106 down to a cross-sectional dimension of about 2–3 nm. A suitable dry etching process known in the art (e.g., reactive ion etching or plasma etching) can be used instead of the wet etching process to remove the oxide layer formed on the middle region 120 of the nanowire 106 following the thermal oxidation process. Optimally, a wet etching process is used for better selectivity.

Figure 12:
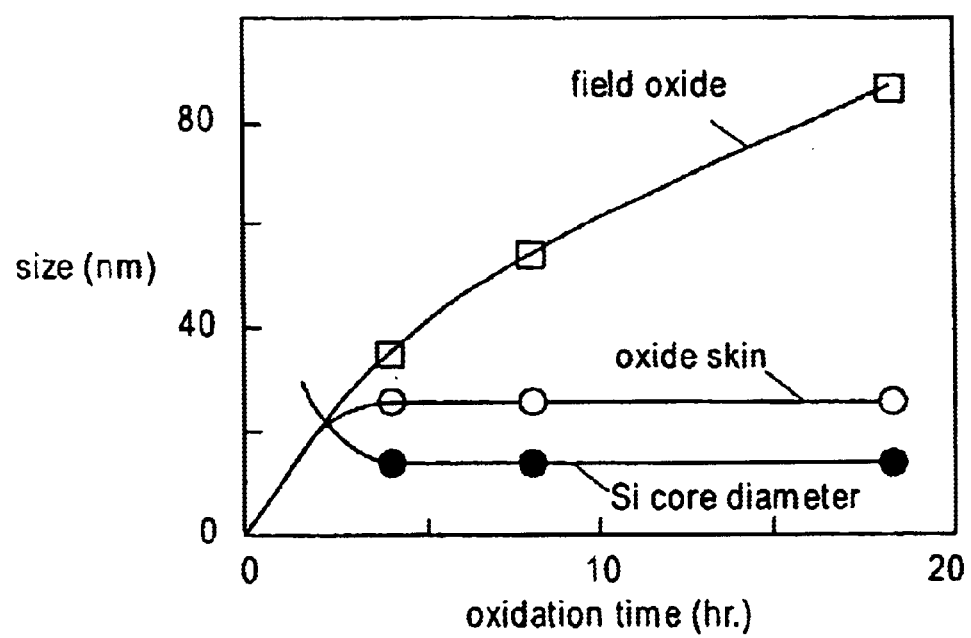
FIG. 12 shows that thermal oxidation of nanoscale semiconductor structure is self-limiting.

It is to be noted that self-limiting oxidation has been observed when small dimension silicon regions are thermally oxidized. This is illustrated in FIG. 12, which is a figure extracted from Fukuda, et al, "Fabrication of silicon nanopillars containing polycrystalline silicon/insulator multiplayer structures," Appl. Phys. Lett. 70, (3) 333 (1997). In Fukuda, studies have indicated that thermal oxidation of a nanoscale silicon structure is self-limiting. Self-limiting oxidation is a stress effect. When the nanoscale silicon structure is thermally oxidized, irrespective of the process variations (e.g., time and temperature variation), the silicon structure is oxidized to a self-limited thickness. The oxidized portion of the silicon structure is removed and the remaining silicon structure can be similarly oxidized again to another self-limited thickness. This process can be repeated as necessary to achieve the desired thickness. As illustrated in FIG. 12, Fukuda oxidized the silicon structure for various durations of time, from about 3 to about 20 hours. The silicon structure is oxidized and the oxided layer is removed to leave the silicon structure with a core thickness of about 10–15 nm irrespective of the oxidation time.

Thus, for a particular nanowire 106, any region of the nanowire 106 can be thermally oxidized relying on the self-limiting oxidation for some control of the thickness to be oxidized. The oxidized portion can be removed. The thermal oxidation and the removal processes can be repeated to oxidize the nanowire 106 to another self-limiting thickness until the desired thickness is achieved. In one embodiment, the thermal oxidation and removal processes are repeated until the nanowire 106 is thinned to about or less than 5 nm. The thinning of a region of the nanowire 106 can be easily controlled because the oxidation thickness for each oxidation process will be less sensitive to process variations such as time and temperature.

Figure 7:
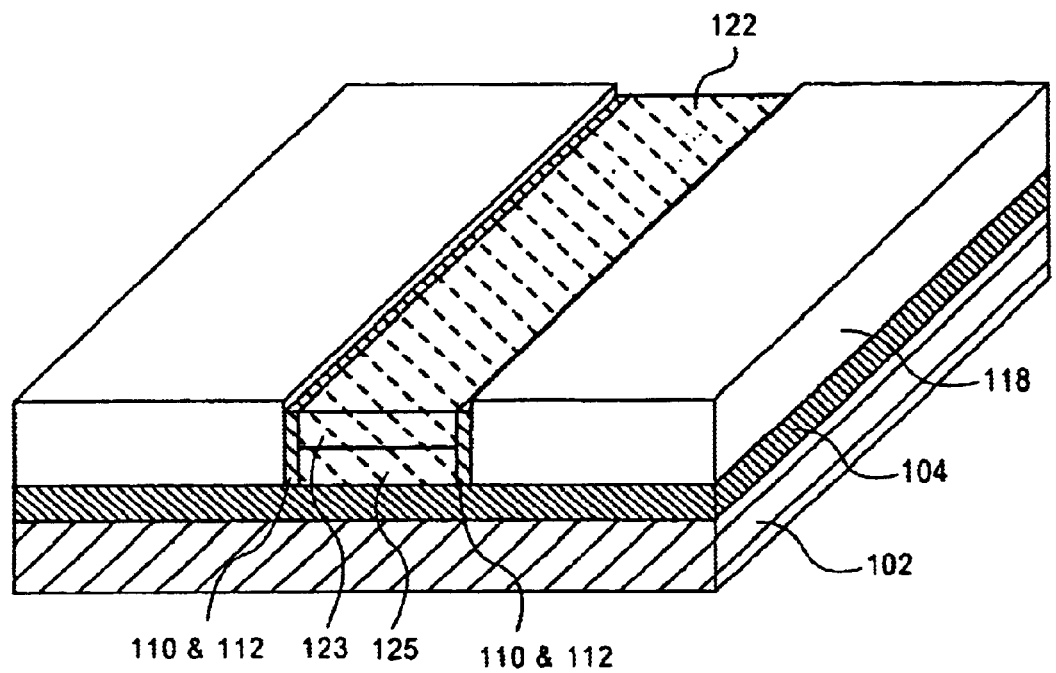
FIG. 7 illustrates that a device gate stack formed over the thinned nanowire of FIG. 6 to form a semiconductor device having an ultra-narrow channel region.

In FIG. 7, a device gate stack 122 is formed over the thinned middle region 120 using conventional methods. In one embodiment, the middle region 120 forms a narrow channel region for the device. The device gate stack 122 comprises a dielectric layer 123 and a gate electrode 125 formed over the dielectric layer 123. In one embodiment, the device gate stack 122 is a conventional gate stack as known in the art. In that embodiment, the gate electrode 125 is a polysilicon film formed on the dielectric layer 123 which can be a silicon oxide film. In another embodiment, the gate electrode 125 is a damascene gate that can be made of a semiconductor material such as silicon, polysilicon, silicon germanium, germanium, or a metal such as copper, aluminum, and titanium. In another embodiment, the gate electrode 125 is made of metal. Having the gate electrode 125 being made of metal avoids the need to treat the gate electrode 125 so that it is conductive as is needed when the gate electrode 125 is made of a semiconductor material such as polysilicon. Additionally, for smaller devices, a metal gate electrode is more beneficial since it allows for lower resistance than would a semiconductor (e.g., polysilicon gate) electrode. In one embodiment, the device gate stack 122 forms a tri-gate structure since it covers three sides of the middle region 120. In another embodiment, the device gate stack 122 is a non-planar structure since it covers all exposed sides of the middle region 120.

An example of a semiconductor device formed according to the methods discussed above is illustrated in FIGS. 8–11. These figures show the device with various layers or structures removed for clarity purposes. The device includes a substrate 102, a first dielectric layer 104, and a nanowire 106. The nanowire 106 includes a middle region 120 that forms a channel region of the device and regions 114 and 116 that form source/drain regions of the device. After the thinning processes as previously described, the channel region of the device is smaller or substantially smaller than each of the source/drain regions. For instance, the channel region may be at least 10–20 times smaller than each of the source/drain regions. Alternatively, the channel region may only be 2 time smaller than each of the source/drain regions. In one embodiment, only the channel region of the device is thinned down from the original cross-sectional dimension using the methods previously described. Thus, the channel region of the device is an ultra-narrow channel region. The source/drain regions of the device can have the same cross-sectional dimension as the original cross-sectional dimension of the nanowire. More optimally, each of the source/drain regions has an epitaxial film formed thereover as previously discussed. Thus, each of the source/drain regions has a cross-sectional dimension that is larger than the original cross-sectional dimension of the nanowire.

The device further includes a device gate stack 122 formed over the channel region of the nanowire 106. The device also includes a first spacer 110 formed adjacent to each side of the device gate stack 122. Alternatively, the device may include a second spacer 112 formed adjacent to each side of the first spacers 110 as previously described. The device may also include a second dielectric layer 118 formed over the source/drain regions (regions 114 and 116) and the first dielectric layer 104. Contact vias (not shown) may be created into the second dielectric layer 118 using methods known in the art to allow for electrical contacts to the source/drain regions.

Figure 8:
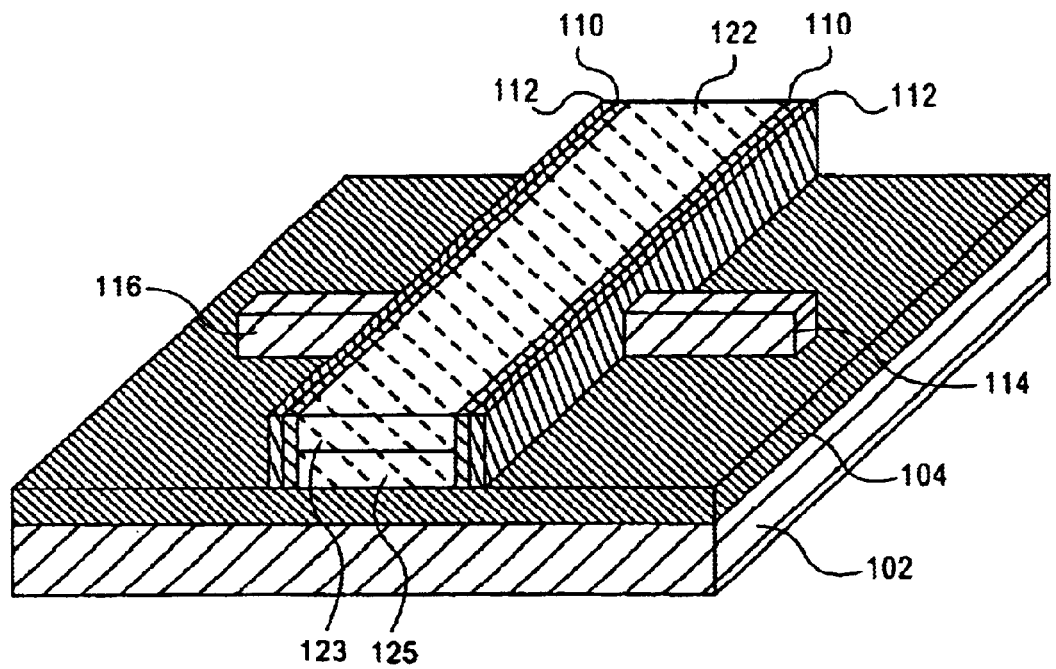
FIG. 8 illustrates the semiconductor device of FIG. 7 with the dielectric layer removed for clarity purpose.
Figure 9:
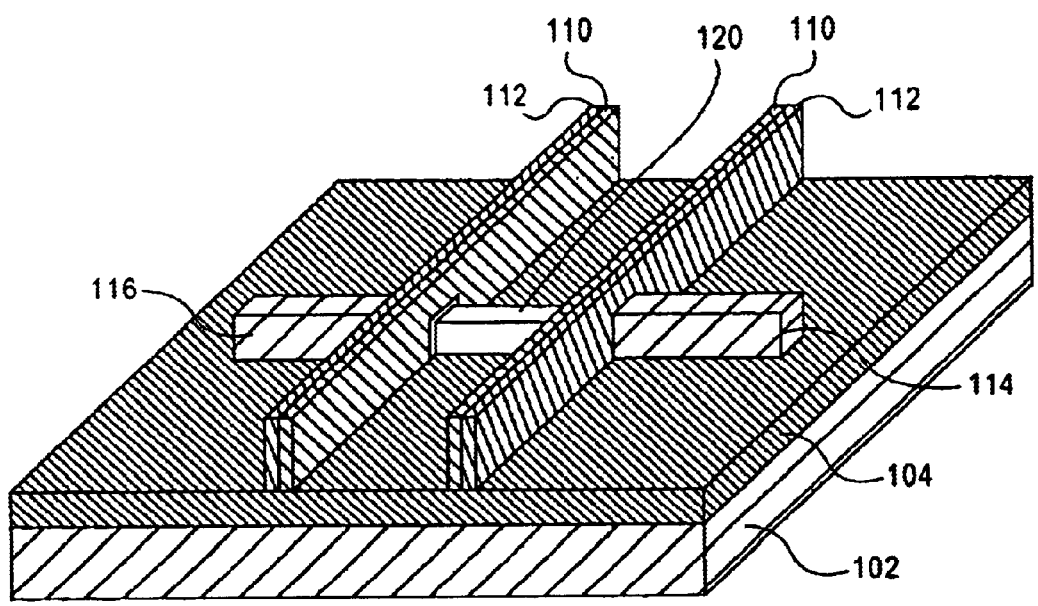
FIG. 9 illustrates the semiconductor device of FIG. 7 with the dielectric layer and the device gate stack removed for clarity purpose.
Figure 10:
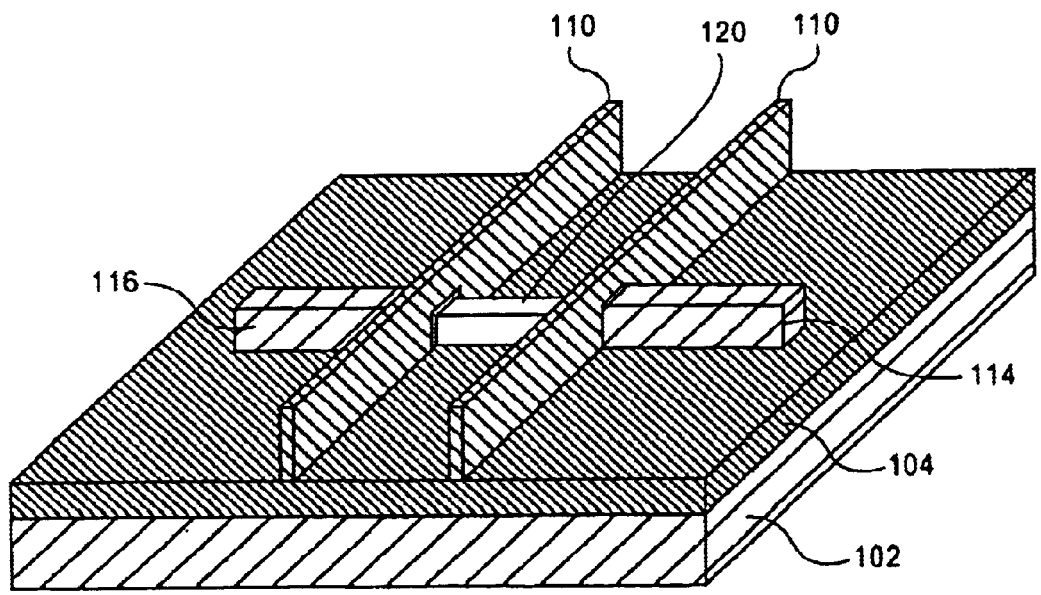
FIG. 10 illustrates the semiconductor device of FIG. 7 with the dielectric layer and the device gate stack removed, and only one spacer is shown for clarity purpose.
Figure 11:
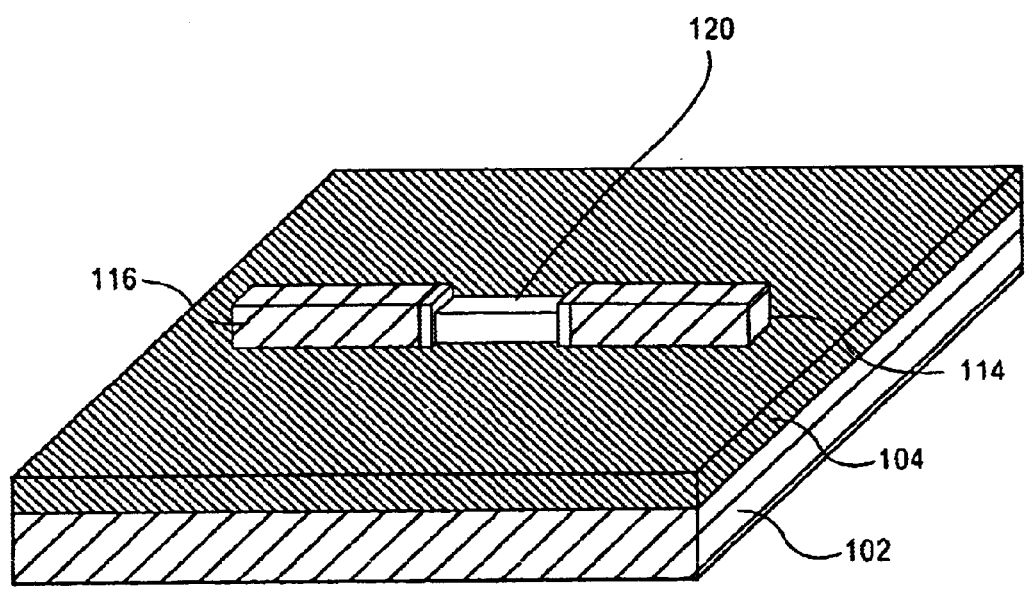
FIG. 11 illustrates the semiconductor device of FIG. 7 with everything removed except for the nanowire having sections of different cross-sectional dimensions.

FIG. 8 shows the device with the second dielectric layer 118 removed to show only the device gate stack 122 formed over the middle region 120 of the nanowire 106, and the first spacers 110 and the second spacers 12 formed on each side of the device gate stack 122. FIG. 9 shows the device with the device gate stack removed to show that the middle region has a smaller cross-sectional dimension than the regions 114 and 116. FIG. 10 shows the device with the second spacers 112 removed to show only the first spacer 110. FIG. 11 shows the device with only the nanowire 106 remained on the first dielectric layer 104. This figure shows that the regions 114 and 116 of the nanowire 106 are substantially larger than the middle region 120.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

We claim:

1. A method of reducing a dimension of a nanowire comprising:

depositing a nanowire on a first dielectric layer formed on a substrate, said nanowire having a first dimension;

depositing a sacrificial gate stack having a sacrificial dielectric layer and a sacrificial gate electrode layer over a first region of said nanowire leaving exposed a second region and a third region of said nanowire;

depositing a first spacer on each side of said sacrificial gate stack;

depositing a second dielectric layer over said first dielectric layer to cover said second region and third region;

removing said sacrificial gate stack; and thinning said first region of said nanowire by at least one thermal oxidation process and oxide removal process to thin said first region from said first dimension to a second dimension.

2. The method of claim 1 wherein said depositing said second dielectric layer is a blanket deposition wherein said second dielectric layer is further polished to exposed said sacrificial gate electrode.

3. The method of claim 1 further comprising:

depositing a second spacer on each side of said first spacer prior to said depositing said second dielectric layer.

4. The method of claim 1 further comprising:

forming an epitaxial film over said second region and third region of said nanowire prior to said depositing said second dielectric layer.

5. The method of claim 1 wherein said thinning said first region further comprises:

sequentially growing oxide layers on said first region by said thermal oxidation and etching away said oxide layers using a buffered oxide etchant until said second dimension reach a desired value.

6. The method of claim 1 wherein said second dimension is at least ten folds smaller than said first dimension.

7. The method of claim 1 further comprising:

forming a silicide layer over each of said second region and third region of said nanowire prior to depositing said dielectric layer.

8. The method of claim 1 further comprising:

implanting dopants into each of said second region and third region of said nanowire to form source/drain regions prior to said depositing said dielectric layer.

9. A method of fabricating a nanowire having a comprising:

depositing a nanowire on a first dielectric layer formed on a substrate, said nanowire having a first dimension;

depositing a sacrificial dielectric layer over a first region of said nanowire and an etchable sacrificial layer over said sacrificial dielectric layer leaving exposed a second region and a third region of said nanowire, (said first region defining a channel region for said nanowire);

depositing a first spacer on each side of said sacrificial dielectric layer and said etchable sacrificial layer;

depositing a second dielectric layer over said first dielectric layer to cover said second region and third region;

etching away said etchable sacrificial layer and said sacrificial dielectric layer; and thinning said first region of said nanowire by at least one thermal oxidation process and oxide removal process to thin said first region from said first dimension to a second dimension.

10. The method of claim 9 further comprising:

depositing a second spacer on each side of said first spacer prior to said depositing said second dielectric layer.

11. The method of claim 9 further comprising:

forming an epitaxial film over said second region and third region of said nanowire prior to said depositing said second dielectric layer.

12. The method of claim 9 wherein said thinning said first region further comprises:

sequentially growing oxide layers on said first region by said thermal oxidation and etching away said oxide layers using a buffered oxide etchant.

13. The method of claim 9 wherein said second dimension is at least ten folds smaller than said first dimension.

14. The method of claim 9 further comprising:

forming a silicide layer over each of said second region and third region of said nanowire prior to said depositing said second dielectric layer.

15. The method of claim 9 further comprising:

implanting dopants into each of said second region and third region of said nanowire to form source/drain regions prior to depositing said second dielectric layer.

16. A method of fabricating an electronic device comprising depositing depositing a nanowire on a first dielectric layer formed on a substrate, said nanowire having a first dimension;

depositing a sacrificial dielectric layer over a first region of said nanowire and an etchable sacrificial layer over said sacrificial dielectric layer leaving exposed a second region and a third region of said nanowire, said first region defining a channel region for said electronic device;

depositing a first spacer on each side of said sacrificial dielectric layer and said etchable sacrificial layer;

forming a source/drain region in each of said second region and said third region;

depositing a second dielectric layer over said first dielectric layer to cover said second region and third region;

etching away said etchable sacrificial layer and said sacrificial dielectric layer;

thinning said first region of said nanowire by at least one thermal oxidation process and oxide removal process to thin said first region from said first dimension to a second dimension; and depositing a device gate stack over said first region, said device gate stack including a third dielectric layer and a gate electrode.

17. The method of claim 16 further comprising:

forming contact to said source/drain region.

18. The method of claim 16 further comprising:

depositing a second spacer on each side of said first spacer prior to said depositing said second dielectric layer.

19. The method of claim 16 further comprising:

forming an epitaxial film over said second region and third region of said nanowire prior to said depositing said second dielectric layer.

20. The method of claim 16 wherein said forming said source/drain region further comprises:

forming an epitaxial film over each of said second region and third region of said nanowire;

implanting a dopant into said second region and said third region; and forming a suicide layer over said epitaxial film.

21. The method of claim 16 further comprising:

forming a silicide layer over each of said second region and third region of said nanowire prior to said depositing said second dielectric layer.

22. The method of claim 16 further comprising:

implanting dopants into each of said second region and third region of said nanowire to form source/drain regions prior to depositing said second dielectric layer.

23. The method of claim 16 wherein said thinning said first region further comprises:

sequentially growing oxide layers on said first region by said thermal oxidation and etching away said oxide layers using a buffered oxide etchant.

24. The method of claim 16 wherein said second dimension is at least ten folds smaller than said first dimension.

25. The method of claim 16 wherein said etchable sacrificial layer comprises silicon or polysilicon.

* * * * *